(12) United States Patent
Paek et al.

(10) Patent No.: US 12,125,816 B2
(45) Date of Patent: Oct. 22, 2024

(54) SEMICONDUCTOR DEVICE ASSEMBLIES AND SYSTEMS WITH ONE OR MORE DIES AT LEAST PARTIALLY EMBEDDED IN A REDISTRIBUTION LAYER (RDL) AND METHODS FOR MAKING THE SAME

(71) Applicant: Micron Technology, Inc., Boise, ID (US)

(72) Inventors: Jong Sik Paek, Taichung (TW); Po Chih Yang, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/342,721

(22) Filed: Jun. 9, 2021

(65) Prior Publication Data
US 2022/0208713 A1   Jun. 30, 2022

Related U.S. Application Data

(60) Provisional application No. 63/132,290, filed on Dec. 30, 2020.

(51) Int. Cl.
| | |
|---|---|
| *H01L 23/00* | (2006.01) |
| *H01L 23/31* | (2006.01) |
| *H01L 25/00* | (2006.01) |
| *H01L 25/065* | (2023.01) |
| *H01L 25/10* | (2006.01) |

(52) U.S. Cl.
CPC .......... *H01L 24/20* (2013.01); *H01L 23/3107* (2013.01); *H01L 24/19* (2013.01); *H01L 24/48* (2013.01); *H01L 24/85* (2013.01); *H01L 25/0657* (2013.01); *H01L 25/105* (2013.01); *H01L 25/50* (2013.01); *H01L 2224/211* (2013.01); *H01L 2224/48147* (2013.01);
(Continued)

(58) Field of Classification Search
CPC ............................................. H01L 2225/06562
See application file for complete search history.

(56) References Cited

U.S. PATENT DOCUMENTS

| | | | |
|---|---|---|---|
| 2007/0289127 A1 | 12/2007 | Hurwitz et al. | |
| 2014/0091440 A1* | 4/2014 | Nair | H01L 24/24 |
| | | | 257/659 |

(Continued)

OTHER PUBLICATIONS

ROC (Taiwan) Patent Application No. 110149070—Taiwanese Office Action and Search Report, dated Aug. 12, 2022, with English Translation, 13 pages.

(Continued)

*Primary Examiner* — Yu-Hsi D Sun
(74) *Attorney, Agent, or Firm* — Perkins Coie LLP

(57) ABSTRACT

A semiconductor device assembly is provided. The assembly includes a redistribution layer (RDL) including a plurality of external contacts on a first side and a plurality of internal contacts on a second side opposite the first side. The assembly further includes a first die at least partially embedded in the RDL and having an active surface between the first side and the second side of the RDL. The assembly further includes one or more second dies disposed over the controller die and the RDL, wherein the one or more second dies electrically coupled to the internal contacts. The assembly further includes an encapsulant at least partially encapsulating the one or more second dies.

10 Claims, 9 Drawing Sheets

(52) U.S. Cl.
CPC ............... *H01L 2224/48225* (2013.01); *H01L 2225/06506* (2013.01); *H01L 2225/0651* (2013.01)

(56) References Cited

U.S. PATENT DOCUMENTS

| | | | |
|---|---|---|---|
| 2016/0233167 A1 | 8/2016 | Shimizu | |
| 2019/0067034 A1* | 2/2019 | Pachamuthu | ..... H01L 23/49822 |
| 2021/0407962 A1* | 12/2021 | Kim | .................... H01L 23/5385 |
| 2022/0013499 A1* | 1/2022 | Eom | .................. H01L 25/0657 |

OTHER PUBLICATIONS

ROC (Taiwan) Patent Application No. 110149070—Taiwanese Office Action, dated Dec. 5, 2022, with English Translation, 9 pages.

\* cited by examiner

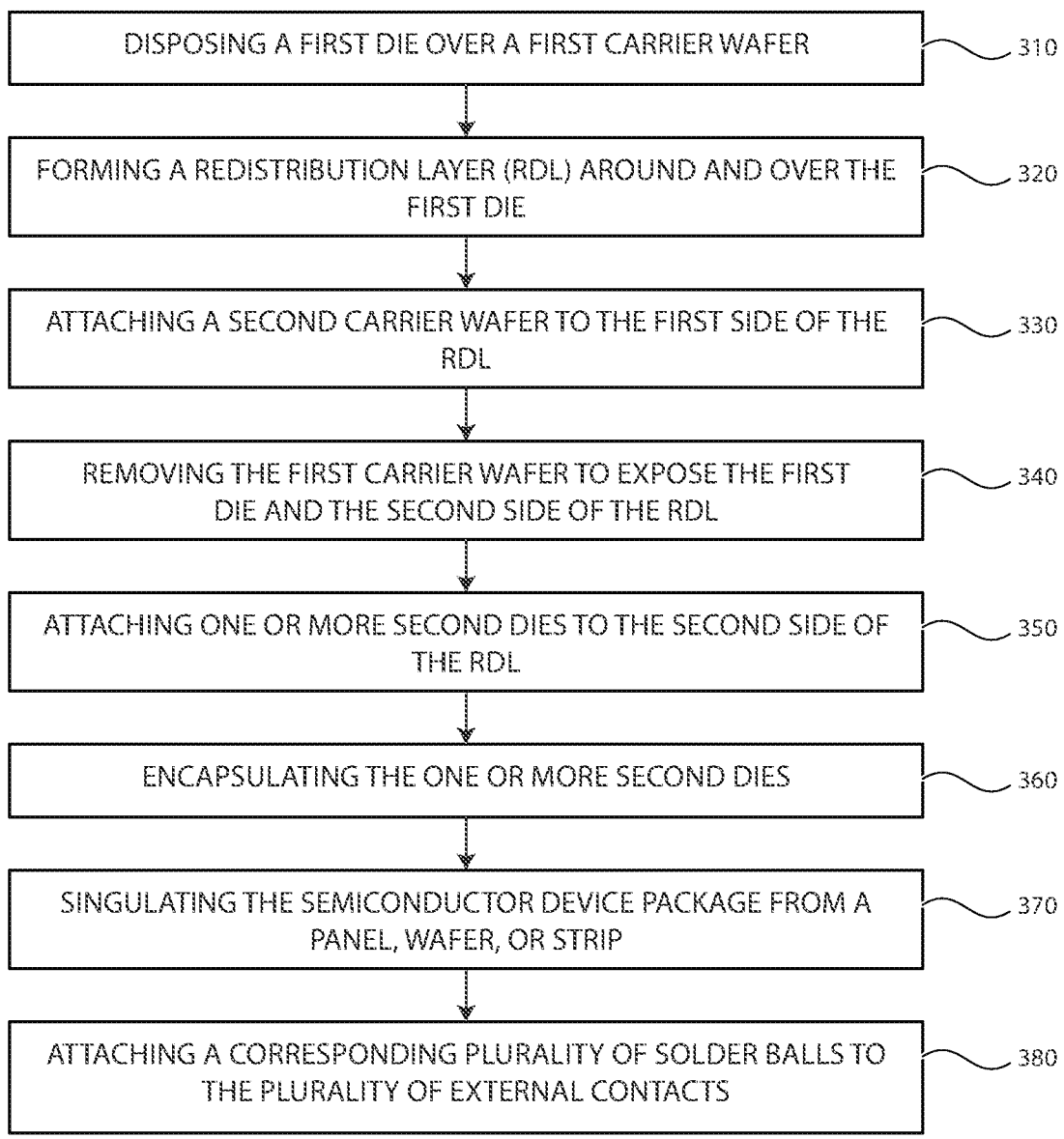

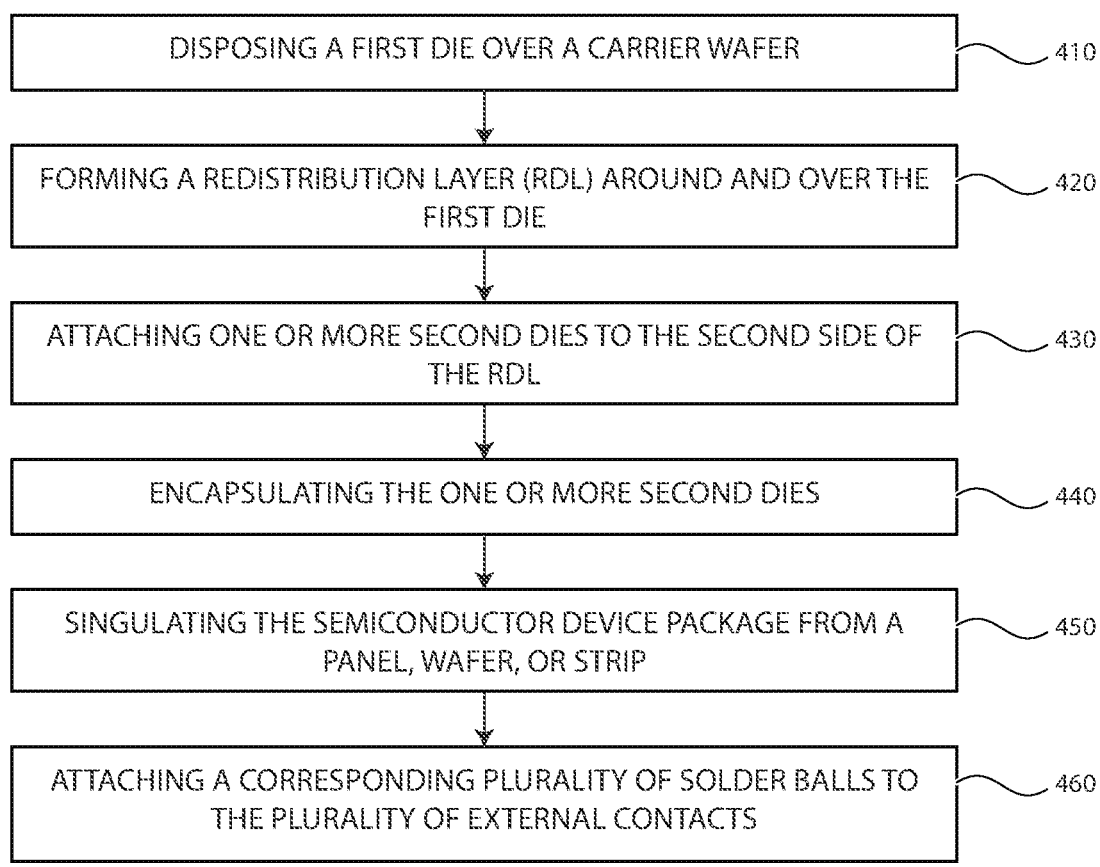

SEMICONDUCTOR DEVICE ASSEMBLIES AND SYSTEMS WITH ONE OR MORE DIES AT LEAST PARTIALLY EMBEDDED IN A REDISTRIBUTION LAYER (RDL) AND METHODS FOR MAKING THE SAME

CROSS-REFERENCE TO RELATED APPLICATION(S)

The present application claims priority to U.S. Provisional Patent Application No. 63/132,290, filed Dec. 30, 2020, the disclosure of which is incorporated herein by reference in its entirety.

TECHNICAL FIELD

The present disclosure generally relates to semiconductor devices, and more particularly relates to semiconductor device assemblies and systems with one or more dies at least partially embedded in a redistribution layer (RDL) and methods for making the same.

BACKGROUND

Packaged semiconductor dies, including memory chips, microprocessor chips, and imager chips, typically include one or more semiconductor dies mounted on a substrate and encased in a protective covering or capped with a heat-conducting lid. In many applications, it is desirable for a semiconductor device assembly to be as thin as practicable. Accordingly, thinner semiconductor device assembly designs and methods for making the same are desired.

BRIEF DESCRIPTION OF THE DRAWINGS

FIG. 3 is a flow chart illustrating a method of making a semiconductor device assembly in accordance with an embodiment of the present technology.

FIG. 4 is a flow chart illustrating a method of making a semiconductor device assembly in accordance with an embodiment of the present technology.

DETAILED DESCRIPTION

Semiconductor device assemblies are incorporated in many products where package height is a concern, such as mobile phones, tablets, laptop computers and the like. Designing a thinner assembly can be a particular challenge when the various devices in the assembly vary widely in size. For example, a memory controller die may be so much smaller than a memory die disposed thereon that spacers are required to support the peripheries of the larger die over the smaller die, adding thickness, cost, and complexity to the assembly design.

To address these challenges, embodiments of the present technology provide semiconductor device assemblies with a redistribution layer (RDL) in which a die is embedded, and on which are provided one or more additional dies. The embedded die and the one or more additional dies can be electrically coupled to each other and/or to external contacts of the assembly by one or more vias and traces formed in the RDL. By embedding a die (e.g., a controller die) in the RDL, the assembly thickness can be greatly reduced, and manufacturing can be performed more easily (e.g., at a panel, wafer, or strip level, and without the need for spacers or thick organic substrates).

Figure 1A:
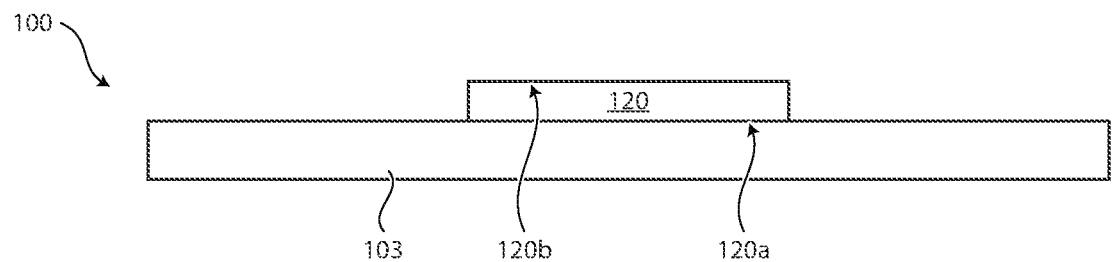
FIGS. 1A-1I illustrate simplified schematic cross-sectional views of a semiconductor device assembly at various stages of manufacture in accordance with various embodiments of the present technology.
Figure 1B:
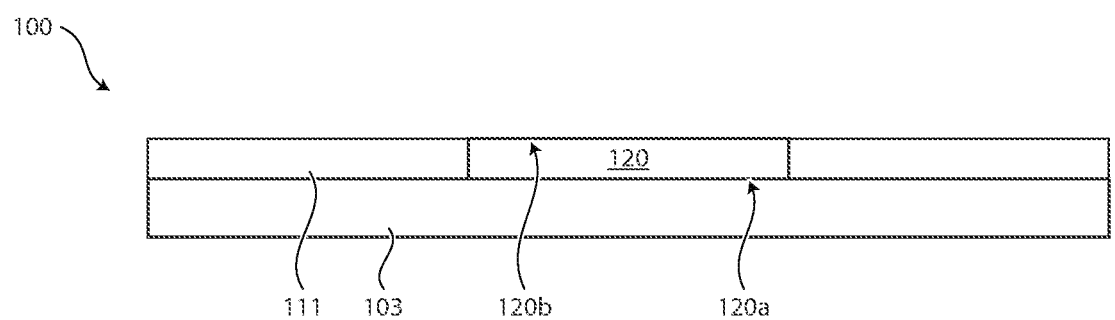
Figure 1C:
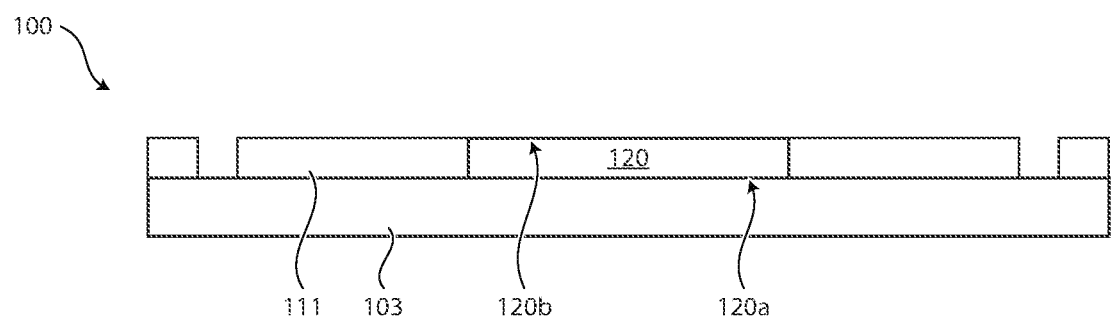
Figure 1D:
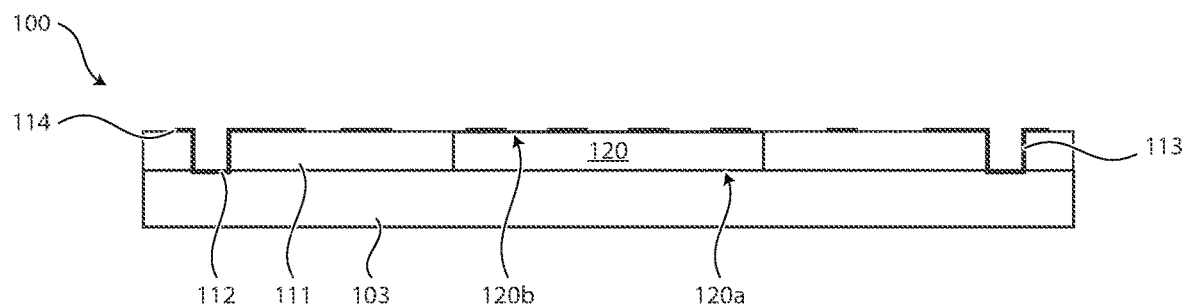

In this regard, FIGS. 1A-1I illustrate simplified schematic cross-sectional views of a semiconductor device assembly 100 at various stages of manufacture in accordance with various embodiments of the present technology. As can be seen with reference to FIG. 1A, a die (e.g., a memory controller die) 120 is disposed on a temporary carrier wafer 103. The die 120 has an active surface 120b and a back surface 120a, and in the present embodiment the back surface 120a is attached (e.g., with a temporary adhesive) to the temporary carrier wafer 103. Turning to FIG. 1B, a layer of dielectric material (e.g. photosensitive polyimide (PSPI)) 111 is formed over the carrier wafer 103 and around the die 120. The dielectric material 111 is then patterned, as shown in FIG. 1C, and a conductive material is plated into the patterned dielectric material 111, as shown in FIG. 1D, to form a variety of conductive features, such as internal contact 112, via 113, and trace 114. These conductive features can provide electrical connections (e.g., power, ground, and signals) to the embedded die 120, the internal contact 112, and/or external contacts (illustrated in greater detail below).

Figure 1E:
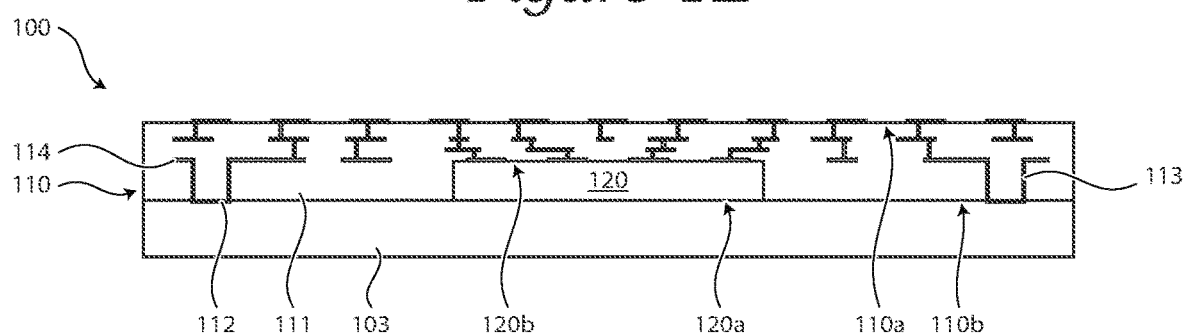

This process of disposing and patterning a dielectric material and plating conductive features is iterated until RDL 110 is complete, as shown in FIG. 1E, with a height defined between a first side 110a on which are provided a plurality of external contacts and a second side 110b on which are provided the plurality of internal contacts. In accordance with one aspect of the present technology, the height of RDL 110 can be less than 100 μm, or less than 75 μm, or even less than 50 μm, depending upon the thickness of the embedded die 120 and the thickness of each iteratively formed layer of conductive features.

Figure 1F:
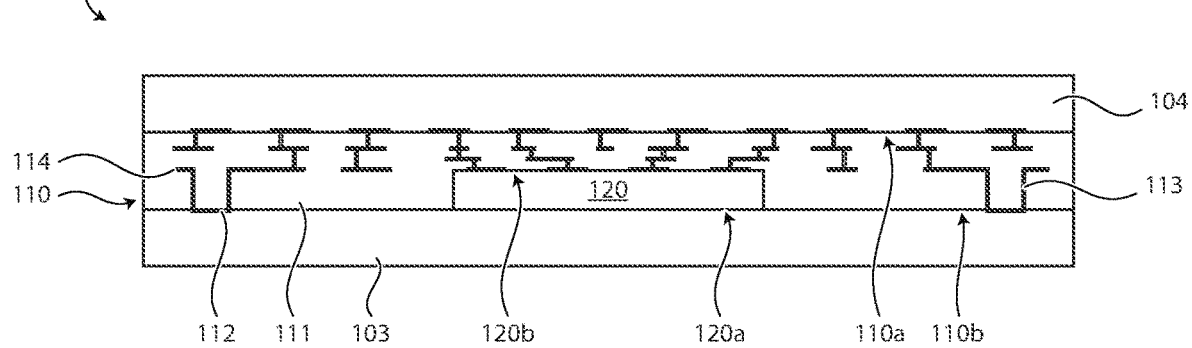
Figure 1G:
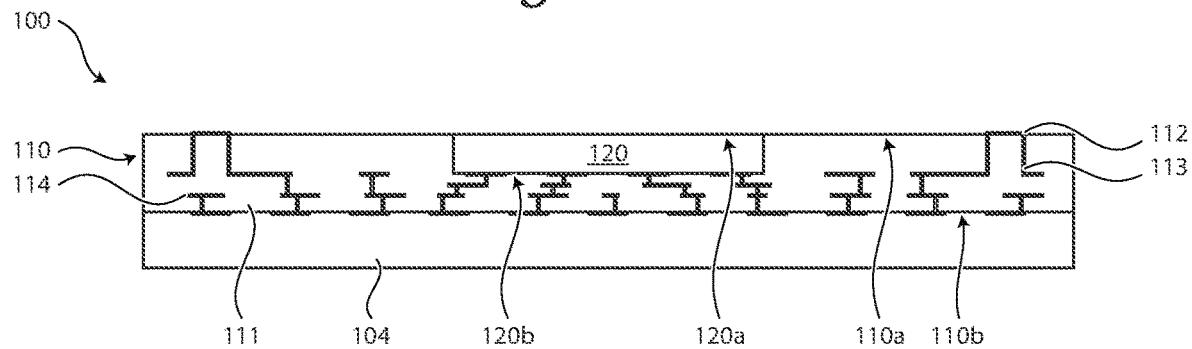

With RDL 110 complete, a second carrier wafer 104 is attached (e.g., with a temporary adhesive) to the first side of the RDL 110a, as shown in FIG. 1F, and the assembly 100 is flipped so that the first temporary carrier wafer 103 can be removed, exposing the back side 120a of the embedded die 120 and the first side of the RDL 110a, as shown in FIG. 1G.

Figure 1H:
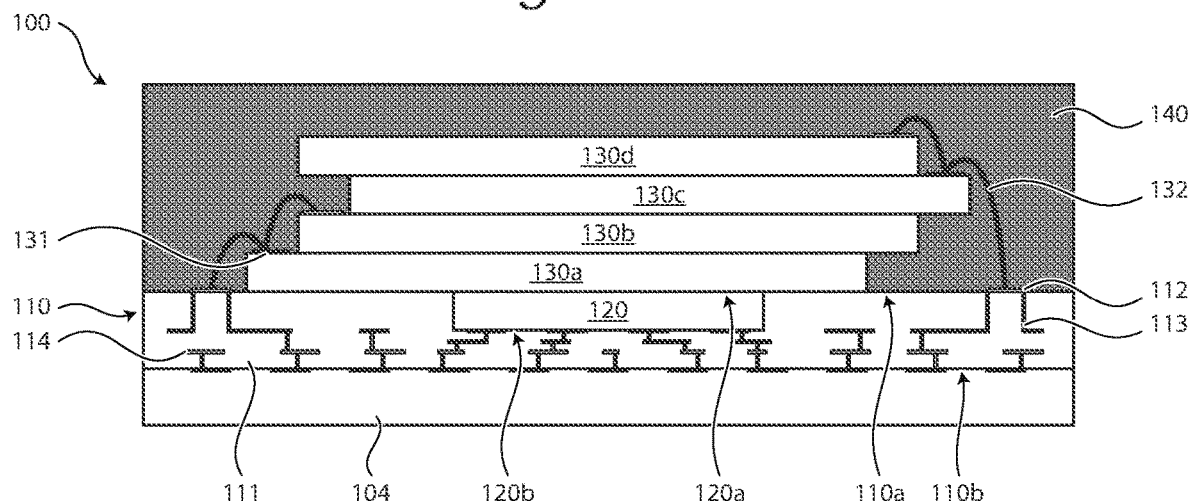
Figure 1I:
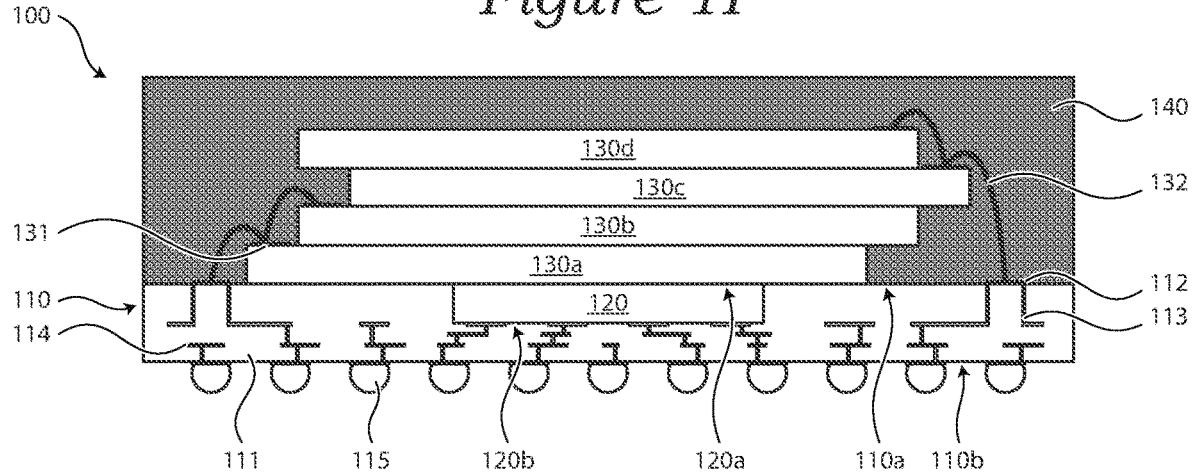

Turning to FIG. 1H, one or more dies (e.g., memory dies such as DRAM and/or NAND dies) 130a-130d can be disposed over the RDL 110 and embedded die 120 (e.g., using die attach film or a similar adhesive), and can be electrically connected to the RDL 110 by forming wirebonds 132 between contact pads 131 on each of the dies and the internal contacts 112 on the first side 110a of the RDL 110, as shown in FIG. 1H. An encapsulant material 140 can then be formed around the one or more dies 130a-130d and wirebonds 132 to provide structural integrity and environmental sealing therefor. The second carrier wafer 104 can then be removed, and a plurality of solder balls 115 can be formed on the corresponding plurality of external contacts on the second side 110b of the RDL 110.

In accordance with one aspect of the present technology, some or all of the foregoing steps can be performed at a wafer, panel, or strip level, to facilitate volume manufacturing. At this stage, or optionally earlier, the assembly 100 can be singulated (e.g., by sawing, plasma dicing, lasing, etc.)

from the wafer, panel, or strip in which it was formed, separating it from other concurrently-formed assemblies. The finished assembly 100 enjoys a number of advantages over conventional assemblies, in that the embedded die 120 reduces the overall package thickness, and obviates the need for spacers to support one or more larger dies (e.g., dies with a larger plan area) thereupon. Moreover, the foregoing process has no need expensive underfill materials, and enjoys a lower thermal budget (e.g., due to the plating of the conductive features in the RDL 110) than other methods of manufacture.

Although in the foregoing example, a semiconductor device assembly has been illustrated and described with a die partially embedded within an RDL (e.g., with one surface of the die exposed flush with a surface of the RDL), in another embodiment of the present technology one or more dies can be completely embedded within (e.g., surrounded on all sides by) an RDL as set forth in greater detail below.

Figure 2A:
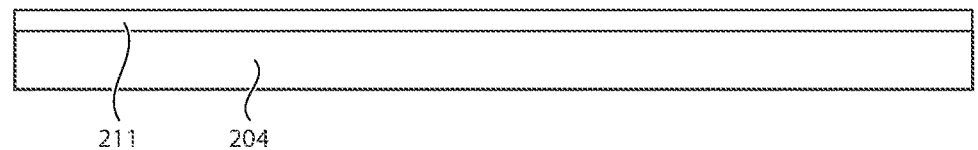
FIGS. 2A-2I illustrate simplified schematic cross-sectional views of a semiconductor device assembly at various stages of manufacture in accordance with various embodiments of the present technology.
Figure 2B:
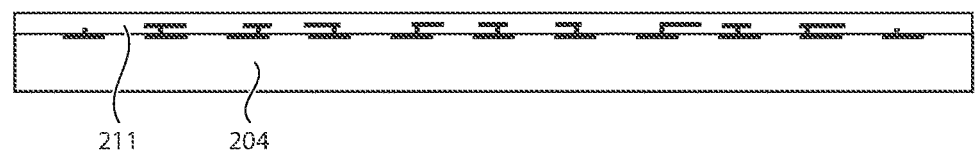
Figure 2C:
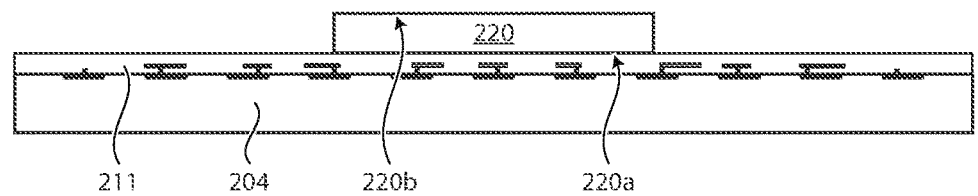
Figure 2D:
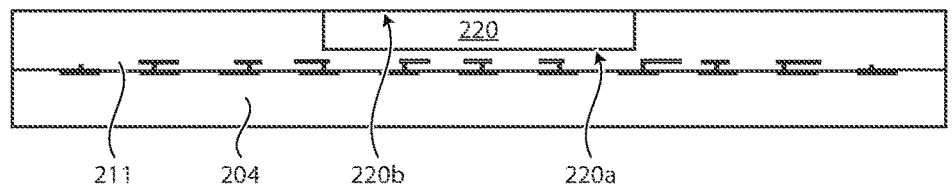
Figure 2E:
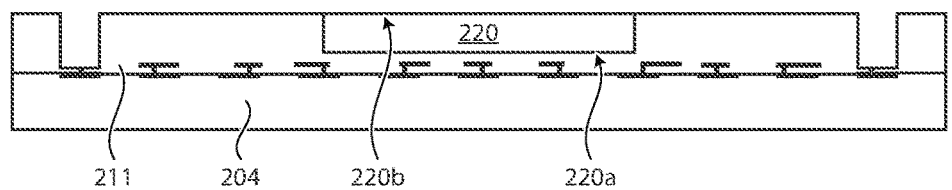
Figure 2F:
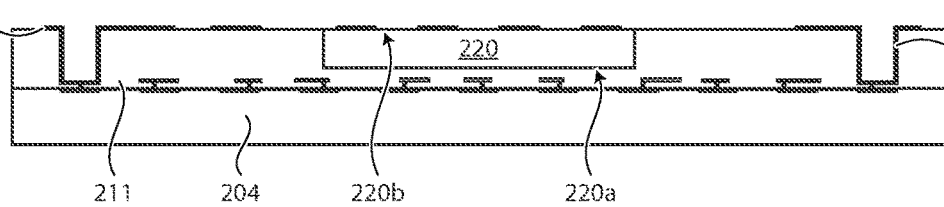

In this regard, FIGS. 2A-2I illustrate simplified schematic cross-sectional views of a semiconductor device assembly 200 at various stages of manufacture in accordance with various embodiments of the present technology. As can be seen with reference to FIG. 2A, a layer of dielectric material (e.g. photosensitive polyimide (PSPI)) 211 is formed over a carrier wafer 204, and then (optionally iteratively) patterned and plated to form part of an RDL, as shown in FIG. 2B. Subsequently, a die (e.g., a memory controller die) 220 is disposed over the partially-fabricated RDL, as shown in FIG. 2C. The die 220 has an active surface 220$b$ and a back surface 220$a$, and in the present embodiment the back surface 220$a$ is disposed face-down over the partially-fabricated RDL (e.g., with the back side facing what will be to the external contacts of the assembly 200). Turning to FIG. 2D, a further layer of dielectric material (e.g. photosensitive polyimide (PSPI)) 211 is formed over the partially-fabricated RDL, continuing its fabrication, and around the die 220. The dielectric material 211 is again patterned, as shown in FIG. 2E, and a conductive material is again plated into the patterned dielectric material 211, as shown in FIG. 2F, to form a variety of conductive features, such as via 213, and trace 214. These conductive features can provide electrical connections (e.g., power, ground, and signals) to the embedded die 220, the internal contacts (described in greater detail below) of the RDL, and/or the external contacts (illustrated in greater detail below) of the RDL.

Figure 2G:
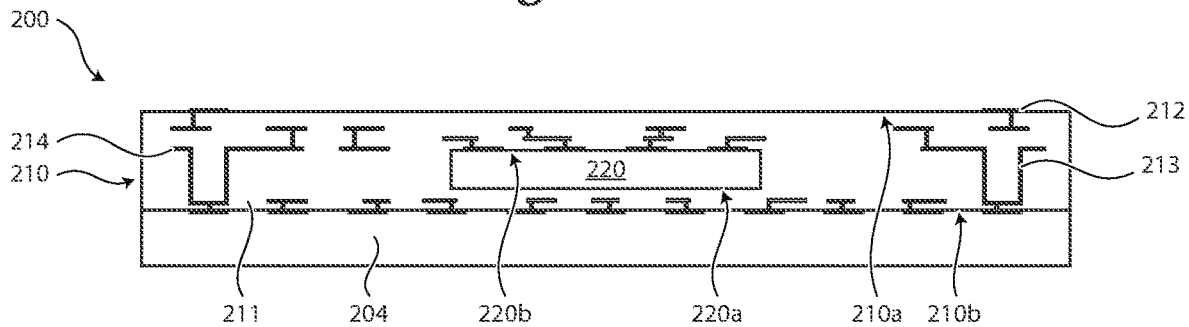

This process of disposing and patterning a dielectric material and plating conductive features can be iterated until RDL 210 is complete, as shown in FIG. 2G, with a height defined between a first side 210$a$ on which are provided a plurality of internal contacts 212 and a second side 210$b$ on which are provided the plurality of external contacts. In accordance with one aspect of the present technology, the height of RDL 210 can be less than 100 μm, or less than 75 μm, or even less than 50 μm, depending upon the thickness of the embedded die 220 and the thickness of each iteratively formed layer of conductive features.

Figure 2H:
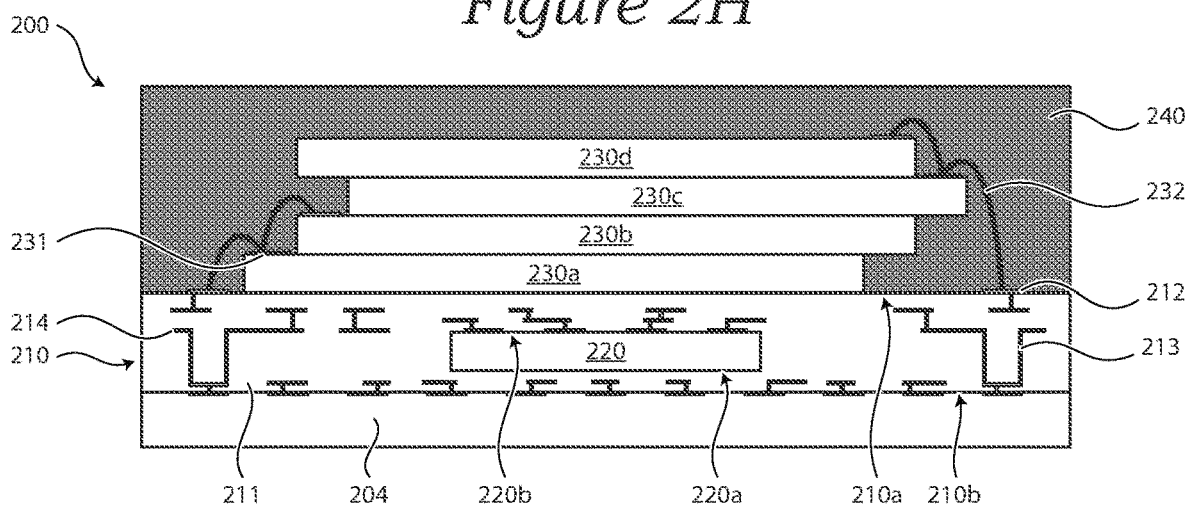
Figure 2I:
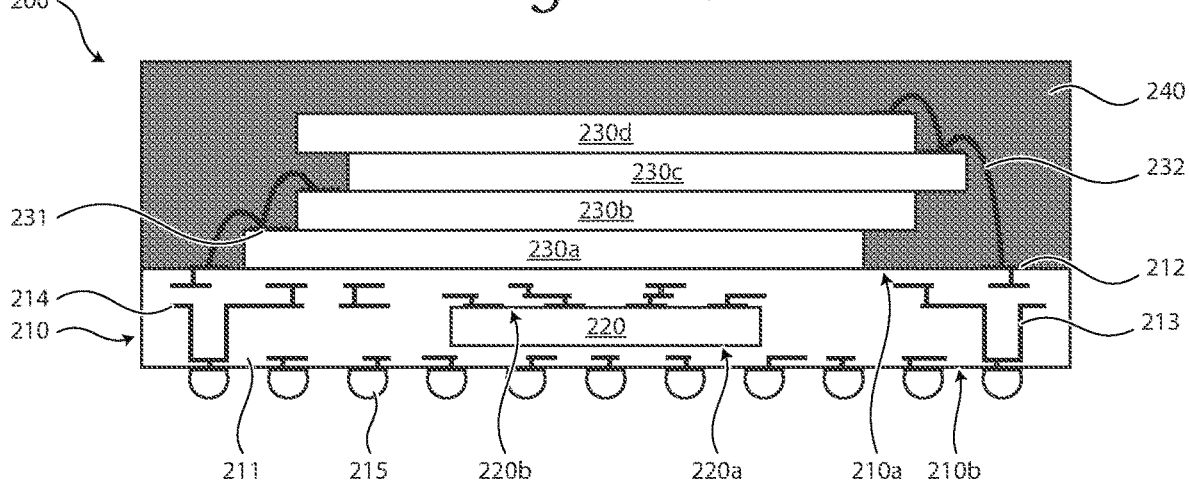

With RDL 210 complete, one or more dies (e.g., memory dies such as DRAM and/or NAND dies) 230$a$-230$d$ can be disposed over the RDL 210 (e.g., using die attach film or a similar adhesive), and can be electrically connected to the RDL 210 by forming wirebonds 232 between contact pads 231 on each of the dies and the internal contacts 212 on the first side 210$a$ the RDL 210, as shown in FIG. 2H. An encapsulant material 240 can then be formed around the one or more dies 230$a$-230$d$ and wirebonds 232 to provide structural integrity and environmental sealing therefor. The carrier wafer 204 can then be removed, and a plurality of solder balls 215 can be formed on the corresponding plurality of external contacts on the second side 210$b$ of the RDL 210.

In accordance with one aspect of the present technology, some or all of the foregoing steps can be performed at a wafer, panel, or strip level, to facilitate volume manufacturing. At this stage, or optionally earlier, the assembly 200 can be singulated (e.g., by sawing, plasma dicing, lasing, etc.) from the wafer, panel, or strip in which it was formed, separating it from other concurrently-formed assemblies. The finished assembly 200 enjoys a number of advantages over conventional assemblies, in that the embedded die 220 reduces the overall package thickness, and obviates the need for spacers to support one or more larger dies (e.g., dies with a larger plan area) thereupon. Moreover, the foregoing process has no need expensive underfill materials, and enjoys a lower thermal budget (e.g., due to the plating of the conductive features in the RDL 210) than other methods of manufacture.

Although in the foregoing examples, semiconductor device assemblies have been described and illustrated as including a plurality of memory die arranged in shingled stacks and connected to an RDL with wirebonds, in other embodiments of the present technology other arrangements of dies can similarly benefit from a design incorporating an RDL with an embedded die. For example, in addition to or in place of dies arranged in a shingled stack and connected by wirebonds, dies can be provided in vertical stacks and connected with other connection methodologies, such as TSVS, solder interconnects, copper-copper connections, hybrid bonding, etc. In some embodiments, rather than a plurality of dies, a semiconductor device assembly may include only a single die over an RDL in which another die is embedded (e.g., attached via direct chip attach (DCA)). Those of skill in the art will appreciate that the foregoing list of examples is not exhaustive, but rather that many other semiconductor device assemblies can be similarly configured with an RDL in which is at least partially embedded one or more die, mutatis mutandis.

Although in the foregoing examples, semiconductor device assemblies have been described and illustrated as including an RDL having a single embedded die, in other embodiments of the present technology multiple dies can be embedded within an RDL of a semiconductor device assembly in a manner similar to those described above. The foregoing approaches to partially embedding and completely embedding a die can be combined, in some embodiments, to provide embedded dies at different heights within an RDL. Alternatively, due to the iterative nature of dielectric disposition, patterning, and plating conductive features, multiple dies can be embedded with overlapping or vertically-aligned positions.

Moreover, although the embedded dies in the above-described examples have been identified as controller dies (e.g., for a managed NAND (mNAND) device), and the one or more dies in a stack have been identified as memory dies (e.g., NAND or DRAM, or combinations thereof), those of skill in the art will readily appreciate that the foregoing assembly topologies can be adapted to other die types. For example, in addition to or in place of memory dies, other kinds of semiconductor devices can be provided in a semiconductor device assembly, such as logic dies, application-specific integrated circuit (ASIC) dies, field-programmable gate array (FPGA) dies, etc. In place of an embedded controller die, other die types can be embedded in an RDL (e.g., memory dies, other logic dies, ASIC dies, FPGA dies, etc.).

FIG. 3 is a flow chart illustrating a method of making a semiconductor device assembly. The method includes disposing a first die over a first carrier wafer (box 310), forming a redistribution layer (RDL) around and over the first die (box 320), and attaching a second carrier wafer to the first side of the RDL (box 330). The method further includes removing the first carrier wafer to expose the first die and the second side of the RDL (box 340), attaching one or more second dies to the second side of the RDL (box 350), and encapsulating the one or more second dies (box 360). The method further includes singulating the semiconductor device package from a panel, wafer, or strip (box 370) and attaching a corresponding plurality of solder balls to the plurality of external contacts (box 380).

FIG. 4 is a flow chart illustrating a method of making a semiconductor device assembly. The method includes disposing a first die over a carrier wafer (box 410), forming a redistribution layer (RDL) around and over the first die (box 420), and attaching one or more second dies to the second side of the RDL (box 430). The method further includes encapsulating the one or more second dies (box 440), singulating the semiconductor device package from a panel, wafer, or strip (box 450), and attaching a corresponding plurality of solder balls to the plurality of external contacts (box 460).

Figure 5:
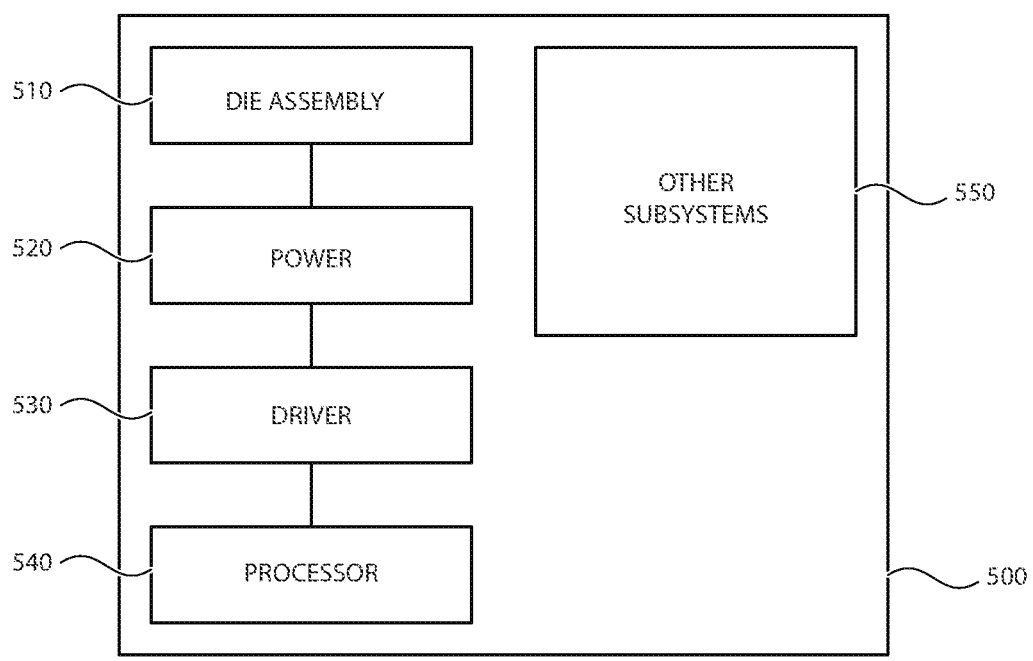
FIG. 5 is a schematic view showing a system that includes a semiconductor device assembly configured in accordance with an embodiment of the present technology.

Any one of the die support structures and/or semiconductor device assemblies described above with reference to FIGS. 1A through 4 can be incorporated into any of a myriad of larger and/or more complex systems, a representative example of which is system 500 shown schematically in FIG. 5. The system 500 can include a semiconductor device assembly 510, a power source 520, a driver 530, a processor 540, and/or other subsystems or components 550. The semiconductor device assembly 510 can include features generally similar to those of the semiconductor device assemblies described above. The resulting system 500 can perform any of a wide variety of functions such as memory storage, data processing, and/or other suitable functions. Accordingly, representative systems 500 can include, without limitation, hand-held devices (e.g., mobile phones, tablets, digital readers, and digital audio players), computers, vehicle and other machines and appliances. Components of the system 500 may be housed in a single unit or distributed over multiple, interconnected units (e.g., through a communications network). The components of the system 500 can also include remote devices and any of a wide variety of computer readable media.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
   a redistribution layer (RDL) including a plurality of external contacts on a first side, a plurality of internal contacts on a second side opposite the first side, a continuous body of a single dielectric material extending from the first side to the second side, and conductive features connecting the internal contacts to the external contacts;
   a first die embedded in the continuous body of the single dielectric material of the RDL, having an active surface and a back surface opposite the active surface, both the active surface and the back surface disposed between the first side and the second side of the RDL such that the back surface and the active surface are at least partially covered by the continuous body of the single dielectric material, wherein the active surface of the first die faces away from the plurality of external contacts, and wherein the conductive features comprise (i) one or more vertical vias extending from the active surface to below the back surface of the first die, (ii) a set of first horizontal traces above the active surface of the first die and below the second side of the RDL, and (iii) a set of second horizontal traces below the back surface of the first die and above the first side of the RDL, exclusive of any seams between the one or more vertical vias and either the set of first horizontal traces or the set of second horizontal traces, and wherein the set of first horizontal traces and the set of second horizontal traces are enclosed within the continuous body of the single dielectric material, one or more second dies disposed over the first die and the RDL, the one or more second dies electrically coupled to the internal contacts; and an encapsulant at least partially encapsulating the one or more second dies.

2. The semiconductor device assembly of claim 1, wherein the first die has a back surface flush with the second side of the RDL.

3. The semiconductor device assembly of claim 1, wherein the active surface of the first die is electrically coupled to one or more of the plurality of external contacts, one or more of the plurality of internal contacts, or a combination thereof, by one or more traces and/or vias disposed in the RDL.

4. The semiconductor device assembly of claim 1, wherein the dielectric material comprises a photosensitive polyimide (PSPI) material.

5. The semiconductor device assembly of claim 1, wherein the one or more second dies includes a lowest die adhered to the second side of the RDL.

6. The semiconductor device assembly of claim 5, wherein the lowest die is further adhered to a back surface of the first die.

7. The semiconductor device assembly of claim 1, wherein the one or more second dies each has an active surface facing away from the second side of the RDL, wherein the active surface of each of the one or more second dies includes one or more pads electrically coupled to one or more of the plurality of internal contacts by one or more wirebonds.

8. The semiconductor device assembly of claim 1, wherein the one or more second dies include at least one DRAM die and at least one NAND die.

9. The semiconductor device assembly of claim 1, further comprising a corresponding plurality of solder balls formed on the plurality of external package contacts.

10. The semiconductor device assembly of claim 1, wherein the plurality of internal contacts includes one or more internal contacts vertically aligned with the first die.

* * * * *